United States Patent
Kim

(10) Patent No.: US 6,622,902 B2
(45) Date of Patent: Sep. 23, 2003

(54) NOZZLE APPARATUS FOR SURFACE MOUNT DEVICE

(75) Inventor: Jong Won Kim, Kyungki-do (KR)

(73) Assignee: Mirae Corporation, Chunan-si (KR)

( * ) Notice: Subject to any disclaimer, the term of this patent is extended or adjusted under 35 U.S.C. 154(b) by 0 days.

(21) Appl. No.: 09/998,185

(22) Filed: Dec. 3, 2001

(65) Prior Publication Data

US 2002/0074379 A1 Jun. 20, 2002

(30) Foreign Application Priority Data

Dec. 19, 2000 (KR) ........................... 2000-78672

(51) Int. Cl.[7] .............................. B23K 37/04; B23K 3/08
(52) U.S. Cl. ..................... 228/49.5; 228/20.1; 228/191
(58) Field of Search ................. 228/49.5, 191, 228/19, 20.1, 49.1, 119

(56) References Cited

U.S. PATENT DOCUMENTS

| | | | |
|---|---|---|---|
| 4,500,032 A | * | 2/1985 | Ackerman ............. 228/180.21 |
| 4,552,300 A | * | 11/1985 | Zovko et al. ............... 228/20.5 |
| 5,285,946 A | | 2/1994 | Tomigashi et al. ............. 228/9 |
| 5,673,844 A | * | 10/1997 | Sargent ....................... 228/102 |

\* cited by examiner

*Primary Examiner*—M. Alexandra Elve
*Assistant Examiner*—Kevin McHenry
(74) *Attorney, Agent, or Firm*—Fleshner & Kim, LLP

(57) ABSTRACT

A nozzle device of a surface mounting device including a holder mounted and adhered closely to socket shafts by an elastic force of elastic members connected to both ends of the socket shafts, and a holder shaft formed on the bottom surface of the holder is disclosed. The nozzle device further includes a nozzle having a moving member assembled to the inside of the holder shaft, and moved in an upward or downward direction due to a pressure of air flown through the holder shaft, for picking up or placing a parts.

2 Claims, 5 Drawing Sheets

NOZZLE APPARATUS FOR SURFACE MOUNT DEVICE

BACKGROUND OF THE INVENTION

1. Field of the Invention

The present invention relates to a nozzle apparatus for a surface mount device, and in particular to a nozzle apparatus for a surface mount device which can improve a blow performance releasing a parts picked up from a parts feeding apparatus of the surface mount device from a nozzle in order to place the parts on a printed circuit board.

2. Description of the Background Art

A surface mount device is used to rapidly precisely mount a plurality of parts on a printed circuit board. A structure of the surface mount device for rapidly and precisely mounting parts on the printed circuit board will now be explained with reference to the accompanying drawings. FIG. 1 is a plan view illustrating the surface mount device. As shown therein, the surface mount device 10 includes an X-Y gantry 11, a printed circuit board conveyor 12, a module head 13, a nozzle exchanging apparatus 14 and a parts feeding apparatus 15.

The printed circuit board conveyor 12 transfers a printed circuit board 1 to a mounting operation position A. The X-Y gantry 11 is moved in an X-Y axis direction to vary a position of the module head 13. The module head 13 picks up a parts from the parts feeding apparatus 15 by using the X-Y gantry 11 as a movement axis, transfers the parts to the printed circuit board 1 in the mounting operation position A, and places the parts on the printed circuit board 1.

The module head 13 includes a plurality of nozzle devices 20. A structure of the nozzle apparatus 20 will now be explained with reference to FIG. 2. Referring to FIG. 2, the nozzle apparatus 20 includes a socket unit 21 and a holder unit 22. The socket unit 21 includes a hollow shaft 21a, an assembly block 21b, a connection block 21c, a socket shaft 21d and an elastic member 21e. The holder unit 22 includes a holder 22a and a holder shaft 22b.

The hollow shaft 21a of the socket unit 21 has a hollow, and the connection block 21c is installed by the assembly block 21b on the bottom surface of the hollow shaft 21a. The holder 22a of the holder unit 22 is provided in the connection block 21c. The socket shaft 21d and the elastic member 21e are disposed at the bottom surface of the connection block 21c to firmly and removably support the holder 22a.

The socket shaft 21d mounted to the connection block 21c is supported at both side portions of the connection block 21c by the elastic member 21e. When the holder 22a of the holder unit 22 is installed to the socket unit 21, the socket shaft 21d supports both side portions of the holder 22a. The holder shaft 22b is formed on the bottom surface of the holder 22a. When the holder 22a is positioned in the connection block 21c, a nozzle (not shown) is inserted and mounted on the holder shaft 22b.

The nozzle picks up the parts from the parts feeding apparatus 15, transfers the parts to the printed circuit board in the operation position, and places the parts on the printed circuit board. When the parts is placed on the printed circuit board, if a blow pressure releasing the parts from the nozzle does not reach into a wanted pressure for a short time (namely, vacuum non-break state), the parts to be mounted is sucked again to the nozzle. In order solve the foregoing problem, a parts blow performance should be improved to precisely and stably mount the parts.

SUMMARY OF THE INVENTION

Accordingly, it is a primary object of the present invention to provide a nozzle apparatus for a surface mount device which can improve a blow performance to precisely and stably release a parts from a nozzle when the nozzle picks up the parts and places the parts on a printed circuit board, by adding a nozzle elastic member and a moving member to the nozzle.

Another object of the present invention is to provide a nozzle apparatus for a surface mount device which can prevent problems such as an operation time delay when a parts sucked by a nozzle is not released from the nozzle, by improving a parts blow performance of the nozzle.

In order to achieve the above-described object of the invention, there is provided a nozzle device of a surface mounting device including a holder mounted and adhered closely to socket shafts by an elastic force of elastic members connected to both ends of the socket shafts, and a holder shaft formed on the bottom surface of the holder, the nozzle device of a surface mounting device comprising: a nozzle having a moving member assembled to the inside of the holder shaft, and moved in an upward or downward direction due to a pressure of air flown through the holder shaft, for picking up or placing a parts.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A nozzle apparatus for a surface mount device in accordance with a preferred embodiment of the present invention will now be described in detail with reference to the accompanying drawings.

Figure 3:
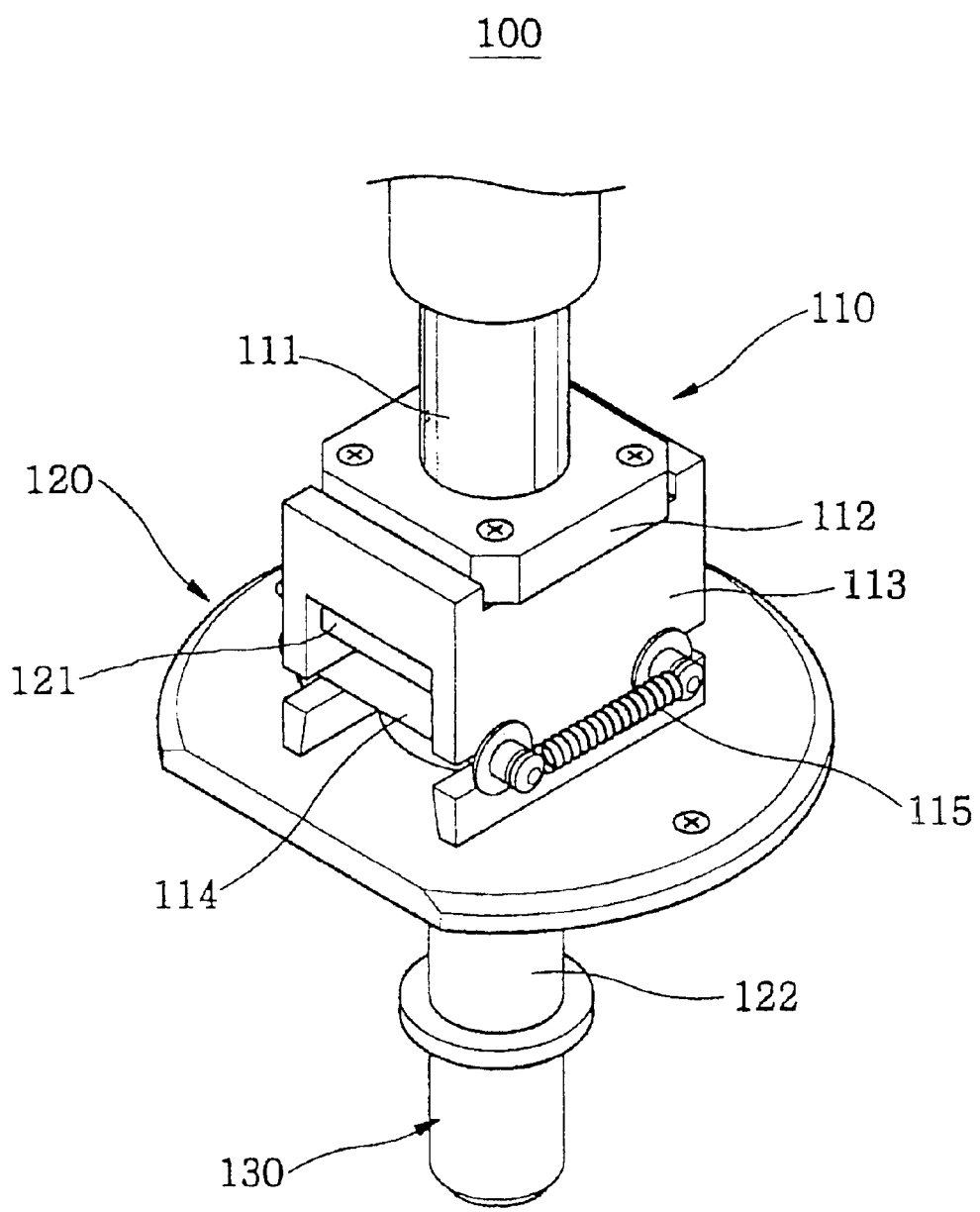
FIG. 3 is a perspective view illustrating a nozzle device in accordance with the present invention.
Figure 4A:
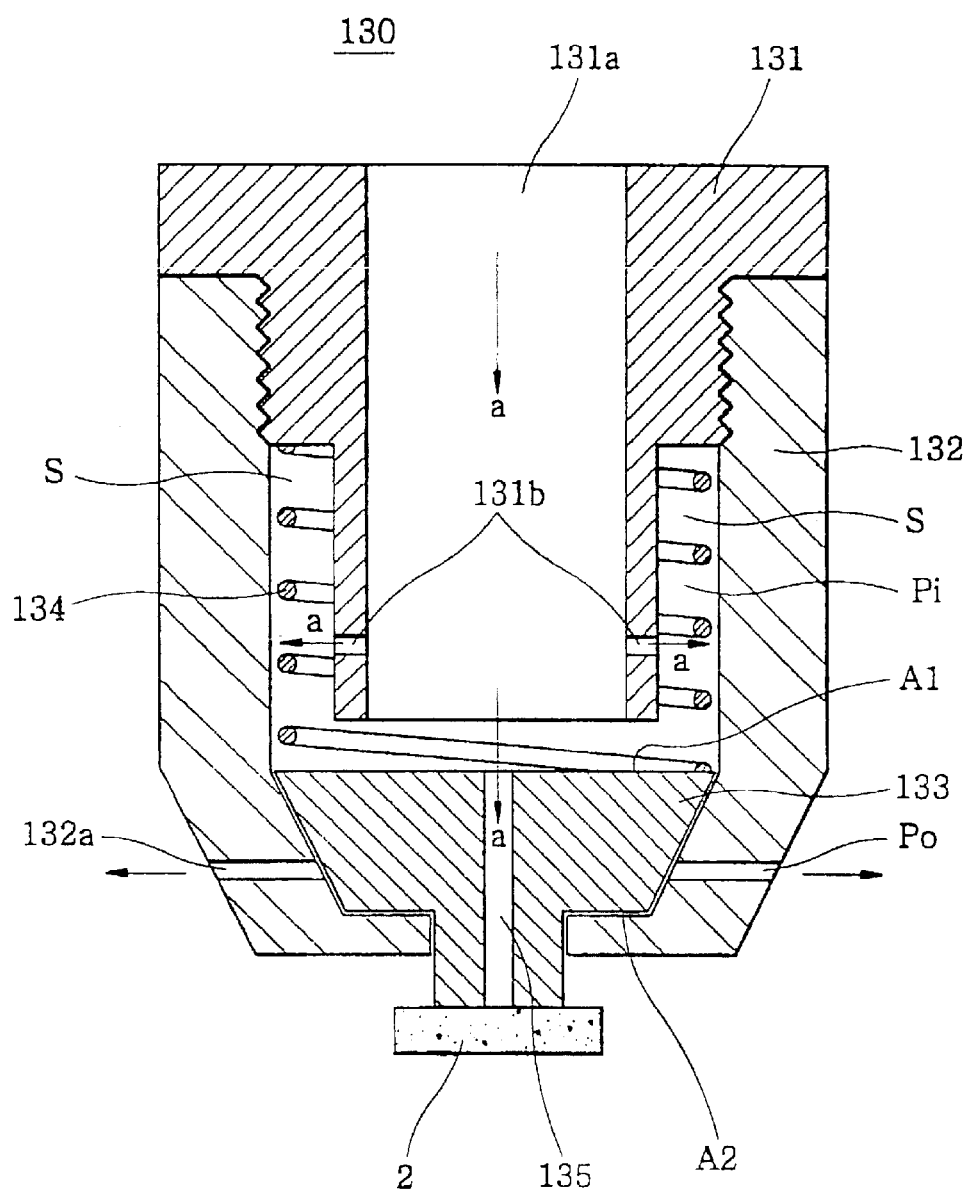
FIGS. 4a and 4b are enlarged cross-sectional views illustrating a nozzle in FIG. 3.
Figure 4B:
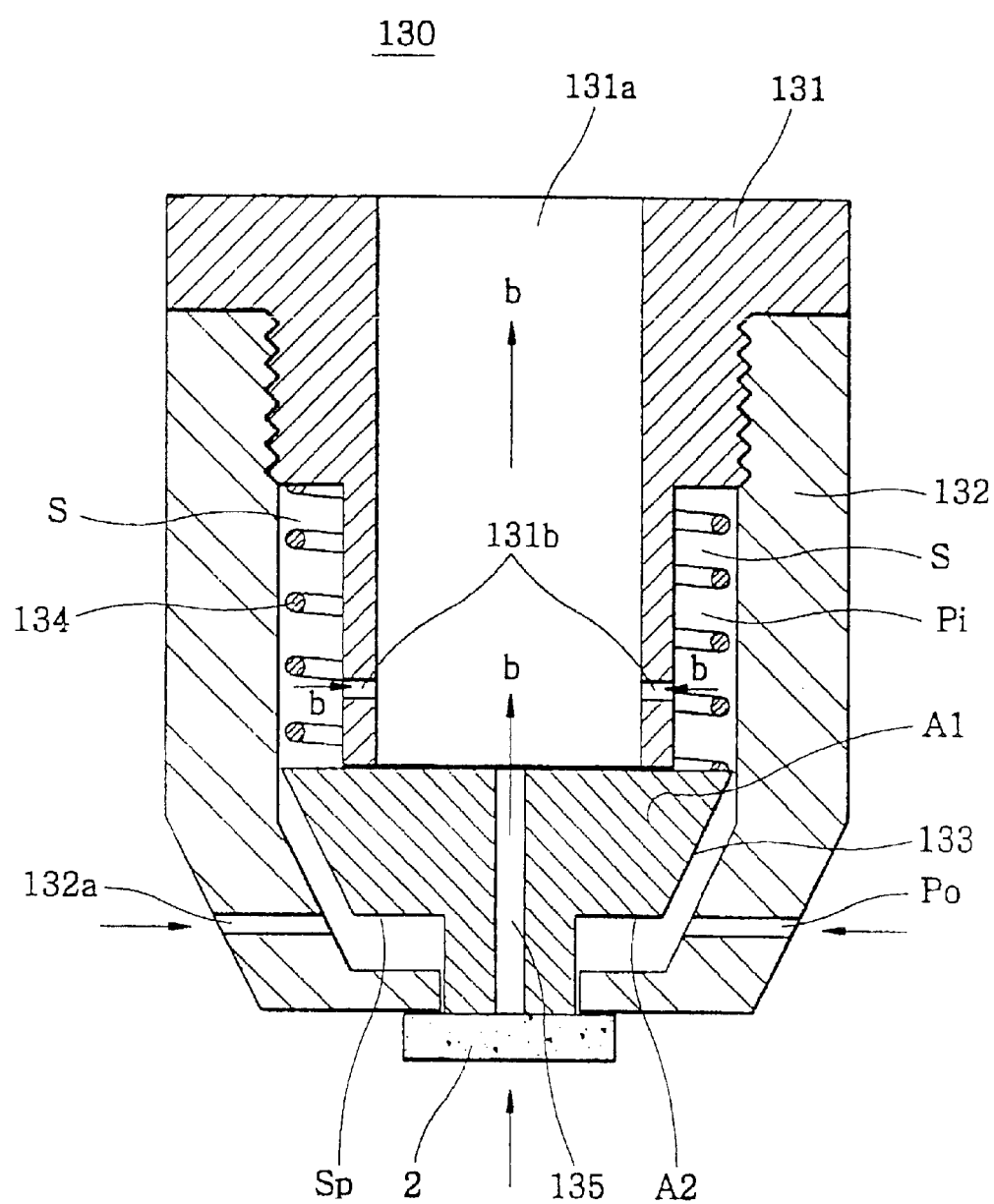

FIG. 3 is a perspective view illustrating the nozzle device in accordance with the present invention, and FIGS. 4a and 4b are enlarged cross-sectional views illustrating a nozzle in FIG. 3. As shown therein, the nozzle device includes: a holder unit 120 having a holder 121 inserted into a socket unit 110, and adhered closely to socket shafts 114 by an elastic force of elastic members 115 connected to both ends of the socket shafts 114, and a holder shaft 122 formed on the bottom surface of the holder 121; and a nozzle 130 having a moving member 133 assembled to the inside of the holder shaft 122, and moved in an upward or downward direction due to a pressure of air flown through the holder shaft 122, for picking up or placing a parts 2.

The structure and operation of the nozzle device in accordance with the present invention will now be described in more detail.

Figure 1:
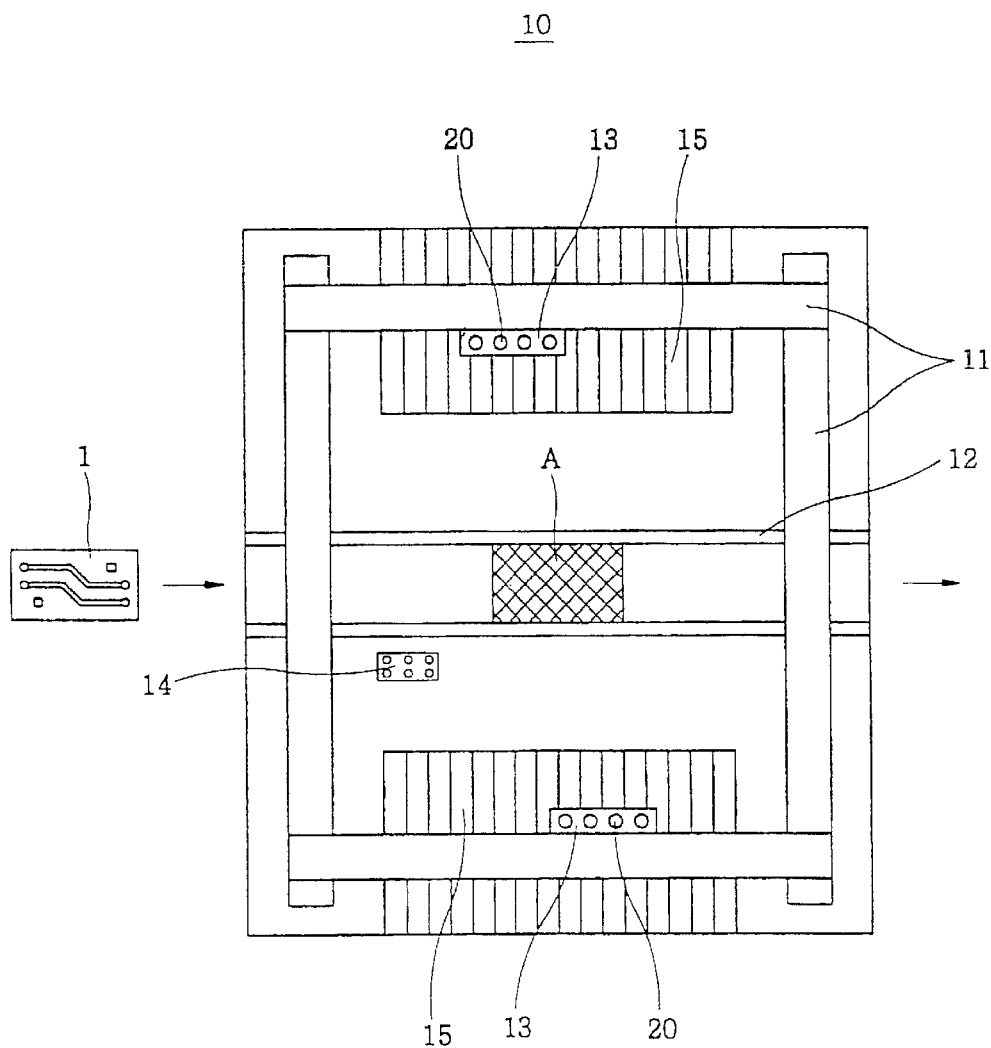
FIG. 1 is a plan view illustrating a surface mount device.
Figure 2:
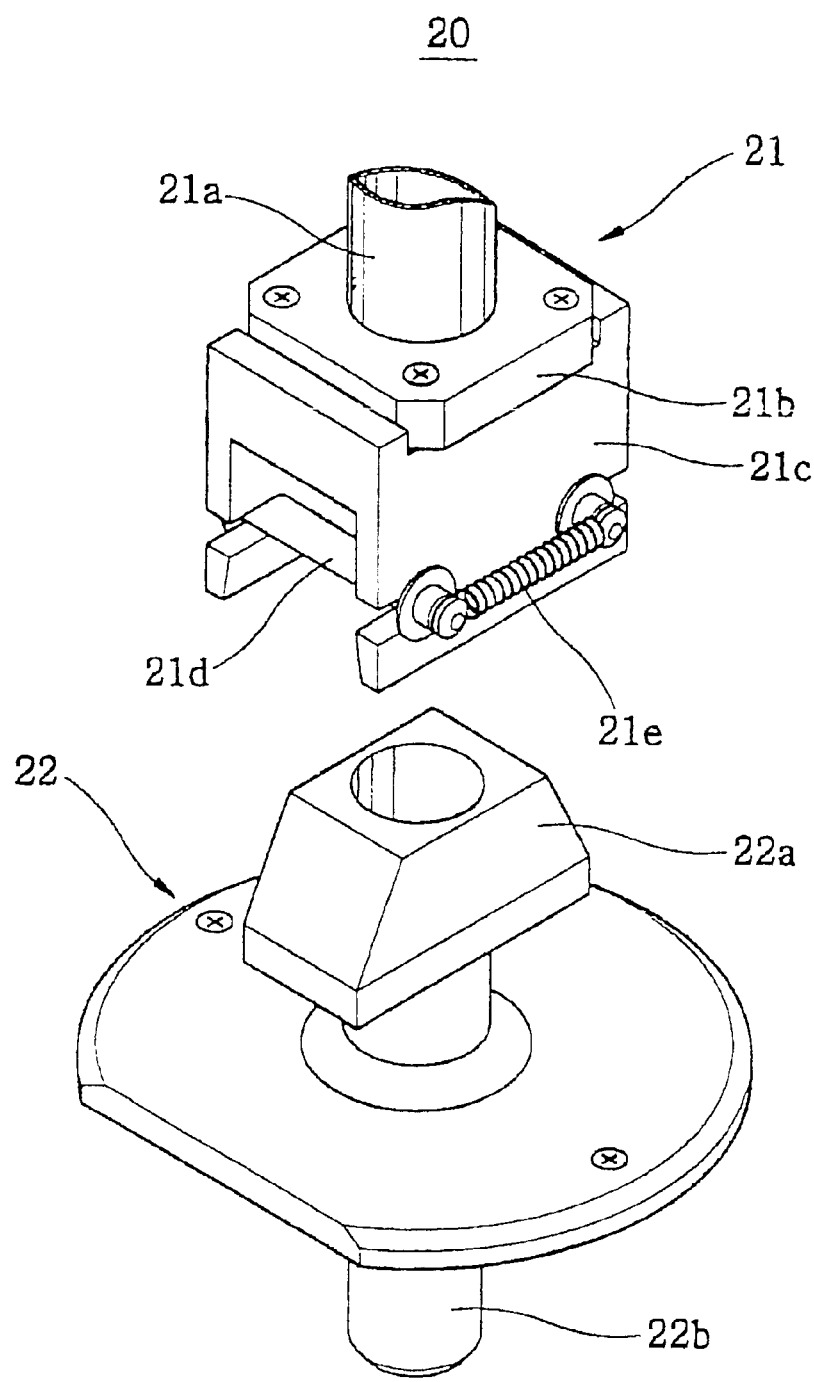
FIG. 2 is a perspective view illustrating a nozzle device of FIG. 1.

The nozzle device 110 includes the socket unit 110, the holder unit 120 and the nozzle 130. In order to replace the holder unit 120, the socket unit 110 is transferred to the nozzle exchanging device (14 in FIG. 1) having the holder unit 120 to be replaced, and moved at a high speed in a vertical direction. The nozzle 130 is connected to the inner portion of the holder unit 120 mounted on the socket unit 110.

In the socket unit 110 transferred at a high speed in a vertical direction to replace the holder unit 120, a connection block 113 is fixedly assembled by an assembly block 112 formed on the bottom surface of a hollow shaft 111, the socket shafts 114 are respectively positioned at both side portions of the connection block 113, and the elastic members 115 are provided to both ends of the socket shafts 114. Here, a compression spring is used as the elastic member 115.

The holder unit 120 mounted on the connection block 113 passing through the socket shafts 114 having the respective assembled elastic members 115 includes the holder (not shown) and the holder shaft 122. The holder (not shown) mounted at the inner portion of the socket unit 110 is adhered to the socket shafts 114 due to an elastic force of the elastic members 115 disposed at both ends of the socket shafts 114. The holder shaft 122 is formed on the bottom surface of the holder (not shown) mounted at the inner portion of the connection block 113 by the elastic members 115 and the socket shafts 114.

The nozzle 130 is installed in the inside of the holder shaft 122. A moving member 133 of the nozzle 130 is moved in an upward or downward direction by a pressure difference due to air flown through the holder shaft 122, thereby picking up or placing the parts 2. The nozzle 130 will now be explained with reference to FIGS. 4a and 4b. Here, FIG. 4a is a cross-sectional view showing an operation state of the nozzle 130 placing the parts 2, and FIG. 4b is a cross-sectional view showing an operation state of the nozzle 130 picking up the parts 2.

Referring to FIGS. 4a and 4b, a first nozzle shaft 131 having a first through hole 131a is installed in the inside of the holder shaft 122. A second nozzle shaft 132 is connected to the first nozzle shaft 131. The moving member 133 having a fourth through hole 135 and a nozzle elastic member 134 are installed in the first nozzle shaft 131 before assembling the second nozzle shaft 132 to the first nozzle shaft 131, and thereafter the second nozzle shaft 132 is assembled.

The moving member 133 installed between the first nozzle shaft 131 and the second nozzle shaft 132 with the nozzle elastic members 134 is guided in an inside space S of the second nozzle shaft 132 by the second nozzle shaft 132, and moved in an upward or downward direction. To elastically move the moving member 133, the nozzle elastic members 134 are installed between the moving member 133 and the first nozzle shaft 131.

The operation for sucking the parts 2 by using the nozzle 130 will now be described with reference to FIG. 4b.

As depicted in FIG. 4b, the first through hole 131a serving as a vacuum path is formed in the inside of the first nozzle shaft 131 in a longitudinal direction, and thus air is injected through the first through hole 131a in an arrow b direction. When air is injected in the arrow b direction, a vacuum Pi is formed in the first through hole 131a of the first nozzle shaft 131, in the space S formed between the first nozzle shaft 131 and the second nozzle shaft 132 through a second through hole 131b formed on a predetermined portion of the outer surface of the first nozzle shaft 131, and in the inside of the fourth through hole 135 formed in the moving member 133 in a longitudinal direction to communicate to the first through hole 131a.

An atmospheric pressure Po of the space Sp formed between the second nozzle shaft 132 and the bottom surface of the moving member 133 due to a third through hole 132a on the outer surface of the second nozzle shaft 132 endures a vacuum pressure Pi formed in the inside of the first through hole 131a of the first nozzle shaft 131, the space S and the inside of the fourth through hole 135, an elastic force F of the nozzle elastic members 134 and a weight Mg of the moving member 133, and pulls up the moving member 133 in the b direction until the moving member 133 is adhered closely to the lower end portion of the first nozzle shaft 131. Here, the parts 2 to be mounted on the printed circuit board 1 is sucked to the fourth through hole 135 formed in the moving member 133 in a longitudinal direction, and thus pulled up with the moving member 133.

The conditions for continuously keeping the suction state of the parts 2 is dependent on the vacuum pressure Pi of the first through hole 131a and the space S between the first nozzle shaft 131 and the second nozzle shaft 132, a vertical projected area A1 of the top surface of the moving member 133 where the vacuum pressure Pi is operated, except for a border area between the moving member 133 and the first nozzle shaft 131, the elastic force F of the nozzle elastic members 134, the weight Mg of the moving member 133, the atmospheric pressure Po generated by the third through hole 132a, and a vertical projected area A2 of the bottom surface of the moving member 133 where the vacuum pressure Po is operated. That is, when '(Pi×A1)+F+Mg>Po×A2' is satisfied, the suction state of parts 2 is constantly maintained.

As shown in FIG. 4a, air is injected in the arrow a direction through the first through hole 131a of the first nozzle shaft 131 to release the sucked parts 2. When air is injected through the first through hole 131a, the vacuum pressure Pi of the space S between the first nozzle shaft 131 and the second nozzle shaft 132 is reduced. When the vacuum pressure Pi is reduced, the moving member 133 is lowered due to a restoring force of the nozzle elastic members 134, thereby forcibly pushing the parts 2.

When the vacuum of the nozzle 130 is broken, the parts 2 sucked to the nozzle 130 is blown to the fourth through hole 135 formed in a longitudinal direction of the moving member 133. In addition, the parts 2 is completely released from the nozzle due to the lowering operation of the moving member 133 by the restoring force of the nozzle elastic members 134.

Accordingly, when the blow pressure does not reach into a wanted pressure for breaking the vacuum in a short time, and thus the parts 2 is sucked again to the nozzle 130, the parts 2 is forcibly pushed by the restoring force of the nozzle elastic members 134, thereby improving the parts blow performance releasing the parts 2 from the nozzle 130.

As discussed earlier, in accordance with the present invention, when the nozzle picks up the parts and places the parts on the printed circuit board, the nozzle device for the surface mount device improves the blow performance to precisely and stably release the parts from the nozzle by adding the nozzle elastic member and the moving member to the nozzle.

Moreover, the nozzle device for the surface mount device improves the blow performance of the nozzle to prevent problems such as an operation time delay generated when the parts sucked by the nozzle is not released from the nozzle.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. In a nozzle device of a surface mounting device including a holder mounted and adhered closely to socket shafts by an elastic force of elastic members connected to both ends of the socket shafts, and a holder shaft formed on the bottom surface of the holder, the nozzle device of a surface mounting device comprising:

a nozzle having a moving member assembled to an inside of the holder shaft, and moved in an upward or downward direction due to a pressure of air blown through the holder shaft, for picking up or placing a parts.

2. The nozzle device of a surface mounting device of claim 1, wherein the nozzle comprises a first nozzle shaft mounted to the inside of the holder shaft and having a first through hole in a longitudinal direction, a second nozzle shaft assembled at one end of the first nozzle shaft, a moving member installed at a lower end of an inside of the first nozzle shaft and capable of moving in a space S formed at the inside of the first nozzle shaft and an outside of the second nozzle shaft, and a nozzle elastic member installed at the space S of an upper end of the moving member to applying an elastic force downwardly to the moving member;

a plurality of second through holes formed on a predetermined portion of an outer surface of the first nozzle shaft to maintain a pressure of a space formed between the first and second nozzle shafts and a pressure formed on the inside of the first nozzle shaft identically; and a plurality of third through holes formed at a lower end of the second nozzle shaft and formed at portions contacting with a side surface of the moving member to form an atmospheric pressure Po to a lower surface of the moving member.

* * * * *